(12) United States Patent
Stamper et al.

(10) Patent No.: US 12,027,580 B2
(45) Date of Patent: Jul. 2, 2024

(54) SEMICONDUCTOR ON INSULATOR WAFER WITH CAVITY STRUCTURES

(71) Applicant: GLOBALFOUNDRIES U.S. INC., Santa Clara, CA (US)

(72) Inventors: Anthony K. Stamper, Burlington, VT (US); Siva P. Adusumilli, South Burlington, VT (US); Bruce W. Porth, Jericho, VT (US); John J. Ellis-Monaghan, Grand Isle, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 284 days.

(21) Appl. No.: 17/028,178

(22) Filed: Sep. 22, 2020

(65) Prior Publication Data
US 2022/0093731 A1    Mar. 24, 2022

(51) Int. Cl.
*H01L 29/06* (2006.01)
*H01L 21/02* (2006.01)
*H01L 21/762* (2006.01)
*H01L 21/764* (2006.01)

(52) U.S. Cl.
CPC .... *H01L 29/0649* (2013.01); *H01L 21/02505* (2013.01); *H01L 21/7624* (2013.01); *H01L 21/764* (2013.01)

(58) Field of Classification Search
CPC ............. H01L 29/0649; H01L 21/7624; H01L 21/02505; H01L 21/764
See application file for complete search history.

(56) References Cited

U.S. PATENT DOCUMENTS

| | | | |
|---|---|---|---|
| 4,786,608 | A | 11/1988 | Griffith |
| 5,723,896 | A | 3/1998 | Yee et al. |
| 6,833,322 | B2 | 12/2004 | Anderson et al. |
| 7,015,147 | B2 | 3/2006 | Lee et al. |
| 7,038,289 | B2 | 5/2006 | Marty et al. |
| 7,078,298 | B2 | 7/2006 | Lee et al. |
| 7,511,317 | B2 | 3/2009 | Adam et al. |
| 7,642,167 | B2 | 1/2010 | Kwon |
| 8,299,537 | B2 | 10/2012 | Greco et al. |
| 8,324,031 | B2 | 12/2012 | Tan et al. |
| 8,455,308 | B2 | 6/2013 | Cheng |
| 8,610,211 | B2 | 12/2013 | Furukawa et al. |
| 8,674,472 | B2 | 3/2014 | Botula et al. |

(Continued)

FOREIGN PATENT DOCUMENTS

JP     2008288384 A  * 11/2008

OTHER PUBLICATIONS

Specification and Drawings in U.S. Appl. No. 16/806,383, filed Mar. 2, 2020, 20 pages.

(Continued)

*Primary Examiner* — Latanya N Crawford Eason
(74) *Attorney, Agent, or Firm* — Francois Pagette; Andrew M. Calderon; Calderon Safran & Wright, PC

(57) ABSTRACT

The present disclosure relates to semiconductor structures and, more particularly, to a semiconductor on insulator substrate with cavity structures and methods of manufacture. The structure includes: a bulk substrate with at least one rectilinear cavity structure; an insulator material sealing the at least one rectilinear cavity structure; and a buried insulator layer on the bulk substrate and over the at least one rectilinear cavity structure.

17 Claims, 6 Drawing Sheets

(56) References Cited

U.S. PATENT DOCUMENTS

| | | |
|---|---|---|
| 8,722,508 B2 | 5/2014 | Botula et al. |
| 8,772,902 B2 | 7/2014 | Assefa et al. |
| 9,633,894 B2 | 4/2017 | Jaffe et al. |
| 10,164,101 B1 | 12/2018 | Camillo-Castillo et al. |
| 10,192,779 B1 | 1/2019 | Shank et al. |
| 10,211,087 B2 | 2/2019 | Jaffe et al. |
| 10,388,728 B1 | 8/2019 | Zierak et al. |
| 10,446,643 B2 | 10/2019 | Adusumilli |
| 10,461,152 B2 | 10/2019 | Stamper et al. |
| 2010/0140739 A1* | 6/2010 | Kim ................ H01L 28/10 257/E29.112 |
| 2011/0183490 A1* | 7/2011 | Gogoi ............... H01L 27/08 257/E21.546 |
| 2012/0292700 A1* | 11/2012 | Khakifirooz ....... H01L 21/84 257/347 |
| 2014/0106095 A1* | 4/2014 | Bianchi ............. B81B 1/00 156/274.4 |
| 2014/0353725 A1 | 12/2014 | Adkisson |
| 2014/0369386 A1* | 12/2014 | Radhakrishnan ..... H01L 35/325 29/25.01 |
| 2015/0348825 A1 | 12/2015 | Hebert |
| 2016/0093523 A1* | 3/2016 | Jaffe ................ H01L 21/764 438/422 |
| 2018/0166536 A1 | 6/2018 | Shank |
| 2020/0144369 A1* | 5/2020 | Lin ................. H01L 27/1203 |
| 2021/0239647 A1* | 8/2021 | Chang ............. B81C 1/00246 |

OTHER PUBLICATIONS

Convey et al., " 30 years of microfluidics", Micro and Nano Engineering, 2019, vol. 2, 16 pages.

Specification and Drawings in U.S. Appl. No. 17/003,179, filed Aug. 26, 2020, 24 pages.

Office Action in U.S. Appl. No. 17/003,179 dated Mar. 30, 2022, 9 pages.

Response to Office Action in U.S. Appl. No. 17/003,179 dated Jun. 28, 2022, 8 pages.

Notice of Allowance dated Jul. 22, 2022 in related U.S. Appl. No. 17/003,179, 9 pages.

* cited by examiner

SEMICONDUCTOR ON INSULATOR WAFER WITH CAVITY STRUCTURES

FIELD OF THE INVENTION

The present disclosure relates to semiconductor structures and, more particularly, to a semiconductor on insulator wafer with cavity structures and methods of manufacture.

BACKGROUND

Device structures, such as radiofrequency switches, are susceptible to high capacitance and body-to-body leakage when formed using a bulk semiconductor wafer. To alleviate these issues, silicon-on-insulator wafers can be used to replace the bulk wafer. The silicon-on-insulator wafers include a buried insulator layer arranged between the body furnishing an active device region of the device structure and the body of the substrate beneath the buried insulator layer. Another measure to reduce the susceptibility of high capacitance and body-to-body leakage is to provide triple well isolation that surrounds the active device region of the device structure.

SUMMARY

In an aspect of the disclosure, a structure comprises: a bulk substrate with at least one rectilinear cavity structure; an insulator material sealing the at least one rectilinear cavity structure; and a buried insulator layer on the bulk substrate and over the at least one rectilinear cavity structure.

In an aspect of the disclosure, a structure comprises: a bulk substrate of single crystalline material; a buried insulator layer on the bulk substrate; and at least one rectilinear cavity structure within the bulk substrate with a top surface being the buried insulator layer.

In an aspect of the disclosure, a method comprises: forming amorphous region of a first depth within a bulk substrate, below a buried oxide layer of semiconductor on insulator (SOI) technologies; forming a vent hole through the buried oxide layer to expose the amorphous region; removing the amorphous region through the vent hole to form at least one cavity structure at the first depth within the bulk substrate; lining the at least one cavity structure with insulator material; and forming a single crystalline semiconductor material on the buried oxide layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a semiconductor on insulator wafer with cavity structures, e.g., airgaps, and methods of manufacture. More specifically, the present disclosure is directed to rectilinear cavity structures, e.g., air gaps, in a bulk wafer of semiconductor-on-insulator (SOI) technology. Advantageously, the present disclosure provides tightly controlled cavity structures in SOI technologies.

In embodiments, the cavity structures are provided in a bulk wafer of the SOI technology, below the insulator layer. The cavity structures are well formed in all dimensions, e.g., X, Y and Z dimensions. For example, the cavity structures are rectilinear structures located below a buried oxide layer (e.g., BOX) of the SOI technologies. The cavity structures can include thermally oxidized sidewalls. In embodiments, the cavity structures can be implemented in switches or microfluidic applications, e.g., MEMS microfluidic applications.

The cavity structures can be formed by an implantation process followed by an etching process as described in more detail herein. For example, implantation of a heavy species through an oxide layer can be used to form amorphous regions, which are subsequently removed by selective etching processes. In embodiments, the implantation process can be an argon implantation process, which is used to control a depth of the cavity structures within the bulk wafer of the SOI technologies. A lithography process can be used to control the location of the cavity structures. The use of the implantation process is well controlled and results in tightly controlled (e.g., width and height control) cavity structures, compared to known isotropic etch processes which have a high variability.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
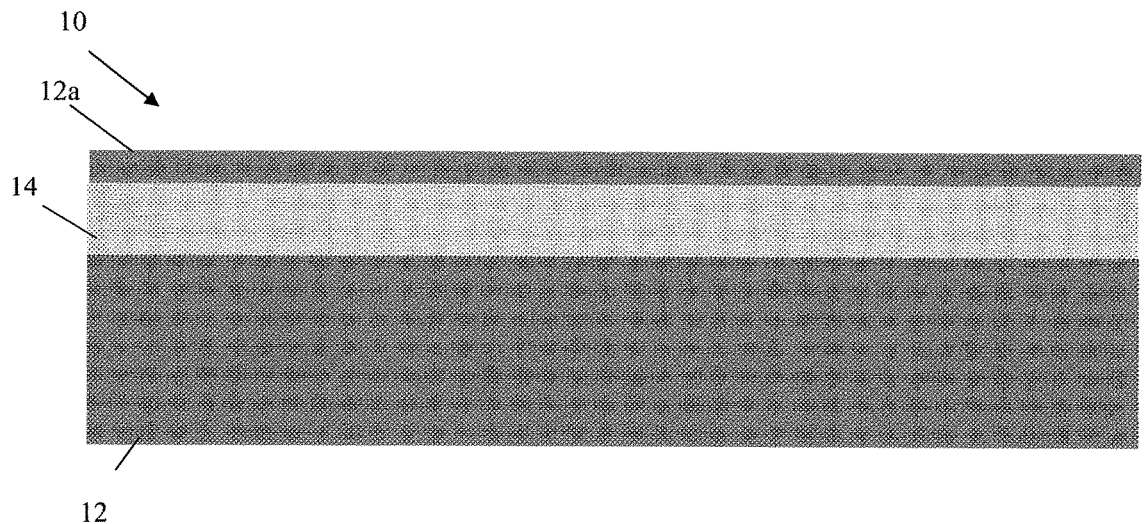
FIG. 1 shows a semiconductor on insulator substrate, amongst other features, and respective fabrication processes according to aspects of the present disclosure.

FIG. 1 shows a substrate and respective fabrication processes according to aspects of the present disclosure. More specifically, the structure 10 of FIG. 1 shows SOI technology which includes a bulk wafer 12, an insulator layer 14 and a semiconductor material 12a on the insulator layer 14. In embodiments, the semiconductor material 12a can be composed of any suitable bulk substrate material, e.g., Si, SiGe, SiGeC, SiC, GaAs, InAs, InP, and other III/V or II/VI compound semiconductors. In preferred embodiments, the semiconductor material 12a and bulk wafer 12 comprise any suitable, single crystallographic orientation (e.g., a (100), (110), (111), or (001) crystallographic orientation), and preferably single crystalline Si. The insulator layer 14 can be any insulator layer with a preference of a buried oxide material (e.g., BOX).

Figure 2:
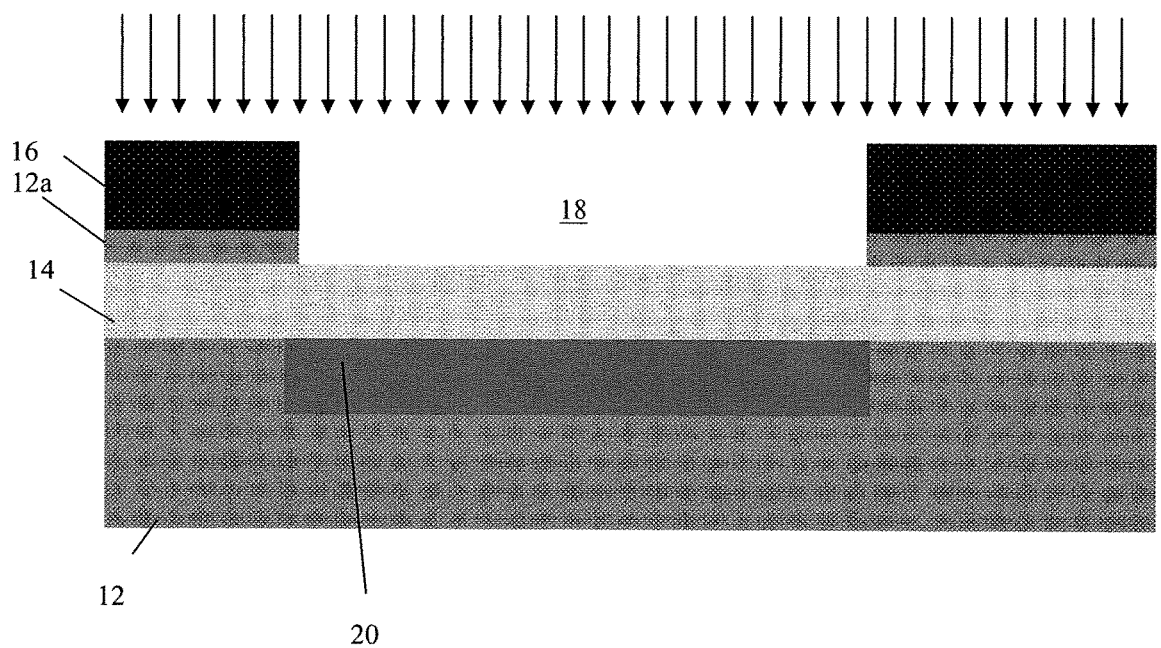
FIG. 2 shows amorphous regions in a bulk wafer of the semiconductor on insulator substrate, amongst other features, and respective fabrication processes according to aspects of the present disclosure.

FIG. 2 shows an amorphous region 20 in the bulk wafer 12 and respective fabrication processes. As described in more detail, the amorphous region 20 is formed in the bulk wafer 12 directly below the insulator layer 14 by an implantation process at a certain energy level. This implantation process results in the bulk wafer 12 being damaged, hence forming the amorphous region 20 below the insulator layer 14.

More specifically, in FIG. 2, a mask 16 is can be formed over the semiconductor on insulator (SOI) wafer 10, the top semiconductor material 12a is removed using any known wet or dry etching process exposing BOX layer 14, and an implantation is performed through the BOX layer 14 to convert the bulk wafer 12 (e.g., crystalline substrate) to an amorphous layer 20. In optional embodiments, semiconductor material 12a is not removed prior to the implant and will be recrystallized after the implantation processes. In embodiments, the recrystallization process will be a rapid thermal anneal (RTA) for up to 60 seconds at temperatures ranging from 900° C. to 1100° C. In embodiments, the RTA is at 1000° C. for 5 seconds.

The mask 16 is any known implantation mask that may include a layer of a light-sensitive material, such as an organic photoresist, applied by a spin coating process, pre-baked, exposed to light projected through a photomask, baked after exposure, and developed with a chemical developer. As should be understood by those of skill in the art, the implantation mask 16 has a thickness and stopping power sufficient to block masked areas against receiving a dose of the implanted ions.

The mask 16 is patterned to form opening 18. The patterning of the mask 16 can be formed by conventional lithography and etching methods known to those of skill in the art. For example, a resist formed over the mask 16 is exposed to energy (light) to form a pattern (opening). An etching process with a selective chemistry, e.g., reactive ion etching (RIE), will be used to form one or more openings (patterns) 18 in the mask 16 through the openings of the resist. The resist can then be removed by a conventional oxygen ashing process or other known stripants.

Prior to the resist removal, an implant process is performed through the opening 18 to form amorphous region 20. In embodiments, the ion implantation process comprises an argon implantation process to form the amorphous region 20 within the bulk wafer 12, at a defined location within the bulk wafer 12. Depending on the energy level, the amorphous region 20 can be extended to different depths. For example, the energy level of the argon implantation can be about 1E14 to 1.5E15 at approximately 100 to 2000 KeV resulting in a depth range from about 0.2 um to about 2.5 μm.

Figure 3:
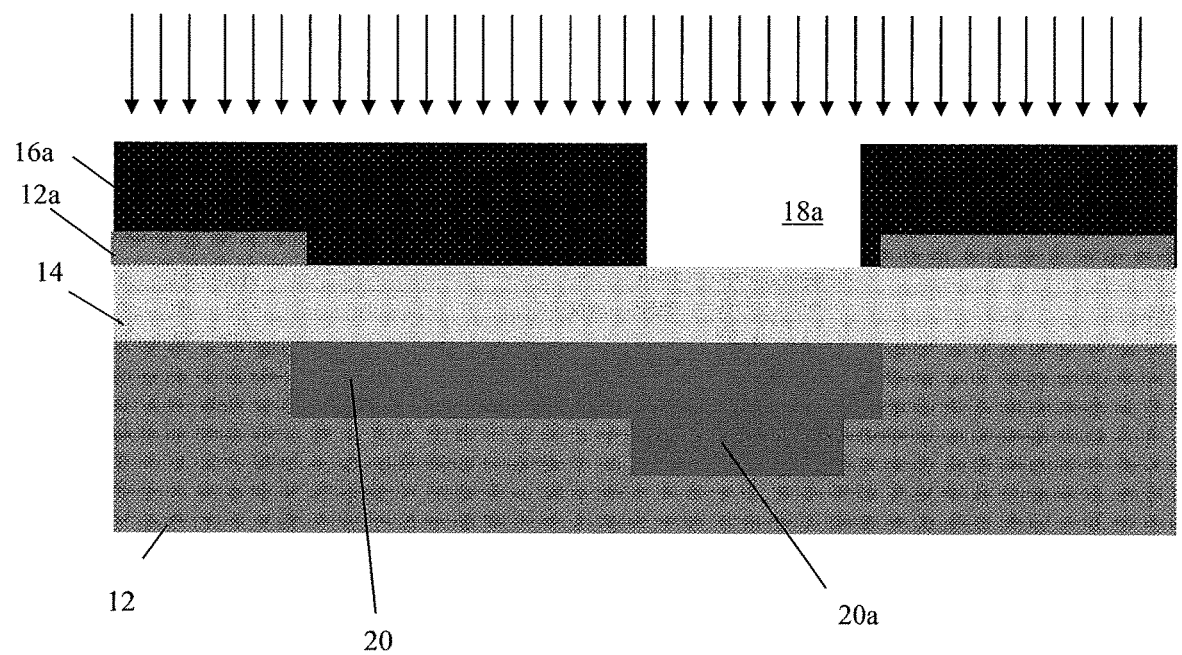
FIG. 3 shows additional amorphous regions in the bulk wafer, amongst other features, and respective fabrication processes according to aspects of the present disclosure.

FIG. 3 shows an optional step of providing a deeper amorphous region 20a in the bulk wafer 12, formed by another implantation process. In this implantation process, the amorphous region 20a in the bulk wafer 12 will be formed at a different depth using a different implant energy (e.g., higher) and/or concentration and patterned mask 16a. This implantation process will effectively form a stepped feature, with different dimensions (e.g., depth) achieved in the first implantation process. It should be understood that the location of the amorphous region 20a can be controlled with the opening 18a in the mask 16a and, hence, can be separate (not shown), partially coincident (not shown), or fully coincident (shown) from the first amorphous region 20.

More specifically, in FIG. 3, following the stripping of the previous mask, a new implantation mask 16a is deposited over the insulator layer 14. The mask 16a is patterned to form opening 18a using conventional lithography and etching methods known to those of skill in the art and as already described herein. Following the patterning, another argon ion implantation process is performed through the opening 18a to form the amorphous region 20a. It should also be understood that by modulating the energy level of the implantation process, it is also possible to modulate the dimensions of the amorphous region 20a, e.g., making the amorphous region 20a larger or smaller than the amorphous region 20. Also, by locating the opening 18a at different locations, it is possible to have the amorphous region 20a positioned remotely from amorphous region 20. Additional amorphous depths could be added by adding additional masking and implantation steps. In an alternative embodiment, opening 18a is formed over the top semiconductor material 12a of the semiconductor on insulator (SOI) as in FIG. 2; or partially over layer 12a and partially over exposed BOX layer 14.

Figure 4:
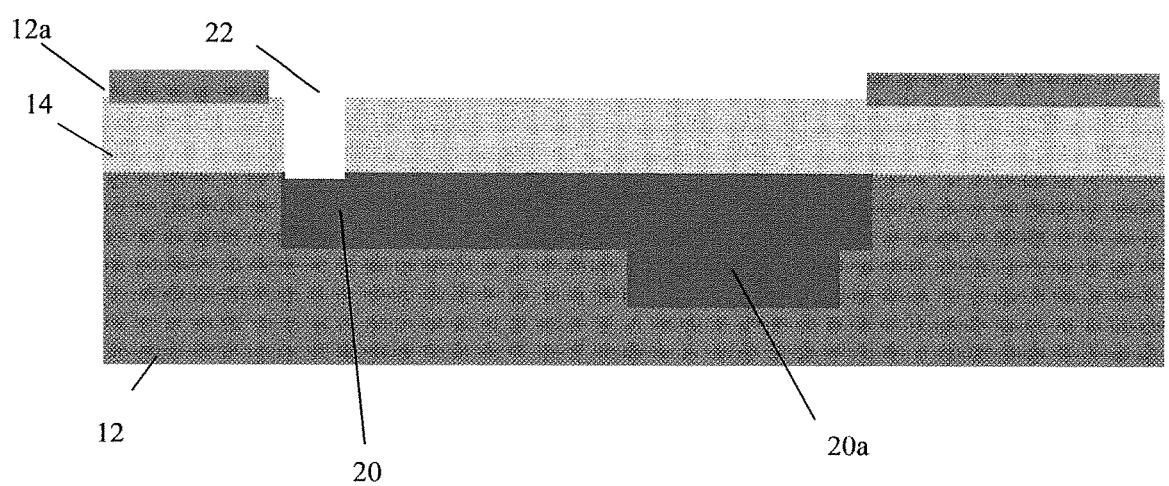
FIG. 4 shows a trench exposing the amorphous regions, amongst other features, and respective fabrication processes according to aspects of the present disclosure.

In FIG. 4, following the stripping of the mask 16a, the structure undergoes vent via formation using conventional lithography and etching processes as already described herein to expose amorphous layer 20; or layers 20 and 20a. In embodiments, the vent via 22 extends into or, at least exposes a top surface, of the amorphous region 20 or amorphous region 20a. In embodiments, the vent via 22 can also be used as a shallow trench isolation feature to isolate, for example, NFET's from PFET's in conventional CMOS as described herein.

Figure 5:
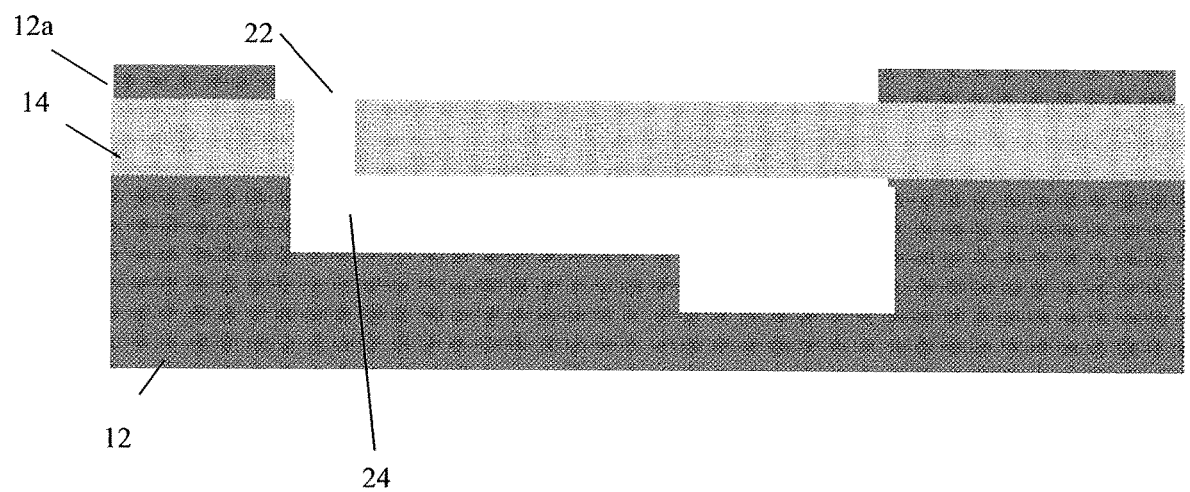
FIG. 5 shows a cavity structure in the bulk wafer, under insulator material, amongst other features, and respective fabrication processes according to aspects of the present disclosure.

FIG. 5 shows the formation of cavity structure 24 and respective fabrication processes. In embodiments, the cavity structure 24 extends from the vent via 22 to underneath the insulator layer 14 and is formed by removing the amorphous regions 20, 20a using a selective etching process that is selective to the BOX layer 14 and the single crystalline material of the bulk wafer 12. This etching process can be, e.g., an aqueous Secco etching process consisting of $K_2Cr_2O_7$ in water mixed with HF through the vent via 22; although other aqueous and dry etching processes are contemplated herein. In this embodiment, the cavity structure 24 is a multi-depth cavity structure due to the different implantation processes; however, it should be understood by those of skill in the art that the second implantation process is optional and, hence, would result in a cavity of uniform depth.

Also, as shown in FIG. 5, the cavity structure 24 is well controlled and results in a tightly controlled (e.g., width and height control) cavity structure of a rectilinear shape. In this embodiment, the rectilinear shape has different depths due to the different implantation processes, which can be controlled by the ion implantation. Also, a top surface of rectilinear cavity structure 24, within the bulk wafer 12, comprises a top surface of the insulator layer 14.

Figure 6:
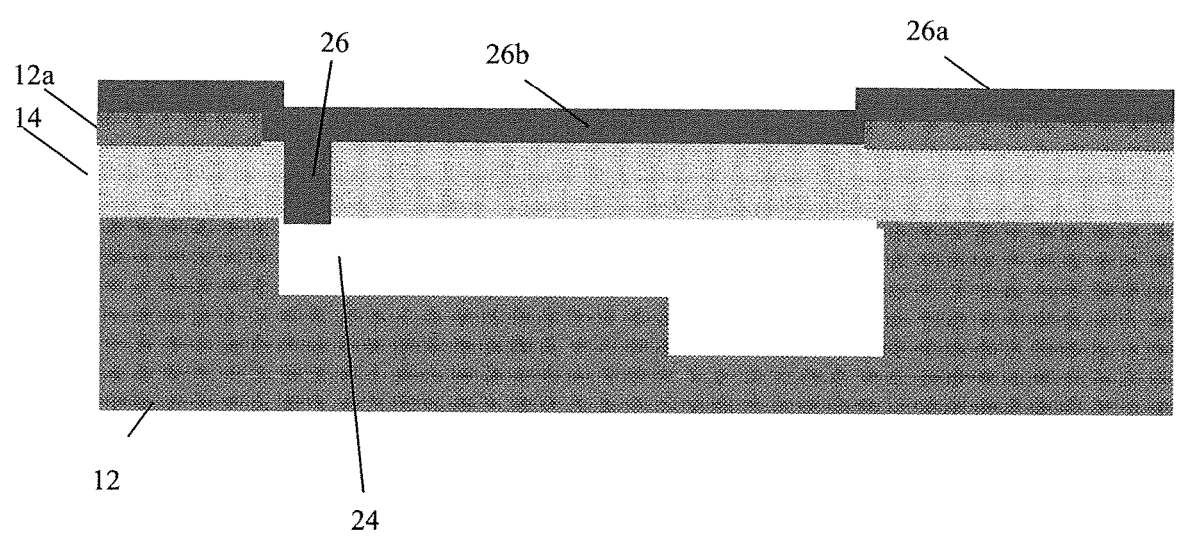
FIG. 6 shows the trench sealed with material, amongst other features, and respective fabrication processes according to aspects of the present disclosure.

FIG. 6 shows the vent via 22 hermetically sealed with a dielectric material 26. In embodiments, the dielectric material 26 is an oxide material; although other insulator materials are contemplated herein. For example, the dielectric material 26 can be any of the materials used for the insulator layer 14. The dielectric material 26 can be deposited by a conventional deposition method such as a chemical vapor deposition (CVD). Following the deposition, in optional embodiments, any excess dielectric material 26a can be removed by a chemical mechanical planarization (CMP) process; or the excess material could be left on the wafer as shown. As discussed above, a CMP process could be performed to remove excess dielectric layer 26a such that dielectric layer 26b forms a STI region (not shown).

Figure 7:
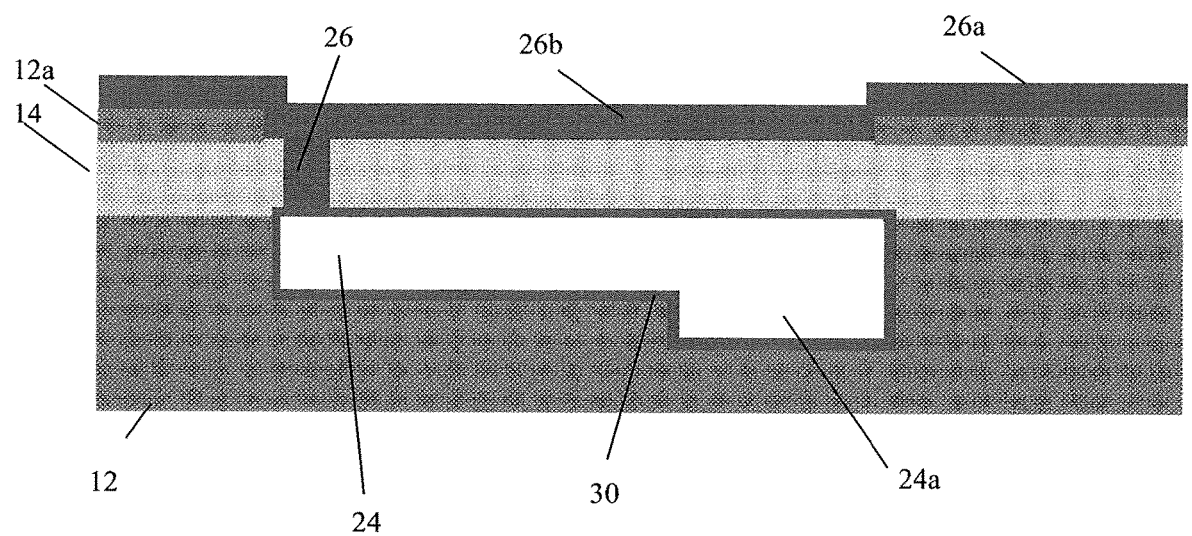
FIG. 7 shows the cavity structure lined with an insulator material, amongst other features, and respective fabrication processes according to aspects of the present disclosure.

FIG. 7 shows an optional embodiment in which sidewalls of the cavity structure 24 are coated with an oxide (e.g., $SiO_2$) or other insulative material 30. For example, the sidewalls of the cavity structure 24 are coated or lined with an oxide material 24a using a conventional furnace or rapid thermal anneal oxidation process. In this embodiment, the oxidation process will line the cavity structure 24 and, if present, region 24a with a thermal oxide (or other insulator material). This oxidization will passivate surface states (i.e., dangling bonds) on the cavity walls and reduce rf losses during device or chip operation. Accordingly and in this way, the insulator material 30 will suppress traps.

Figure 8:
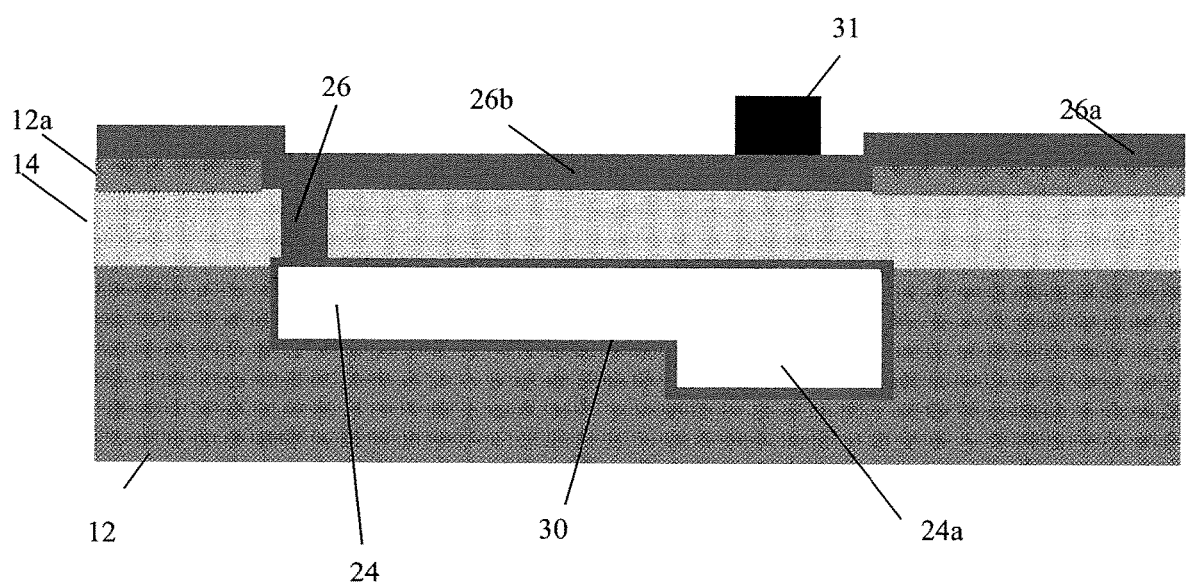
FIG. 8 shows an optional embodiment in which an electrode is used in a microfluidic MEMs application.
Figure 9A:
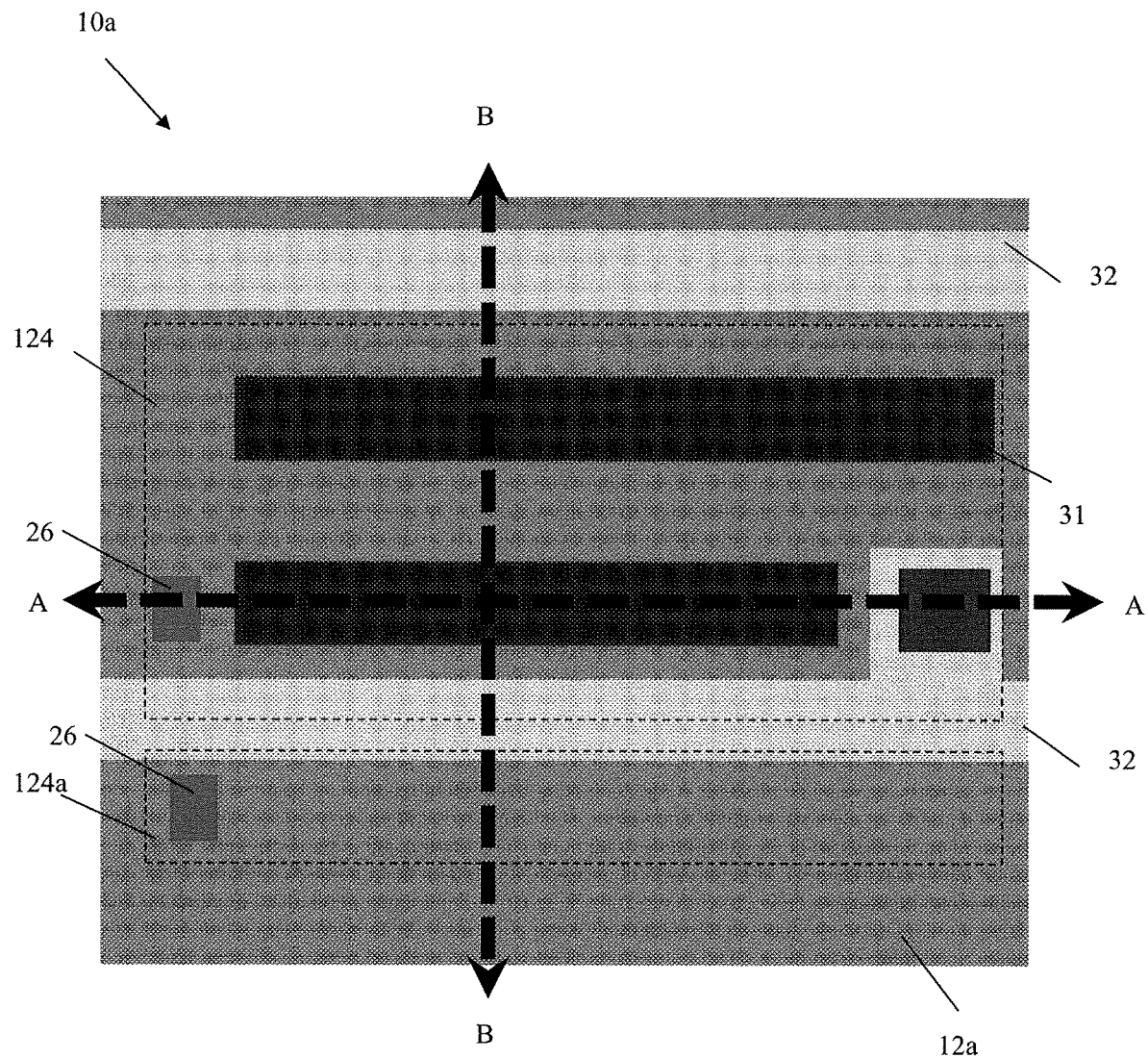
FIG. 9A shows a top view of a structure with devices over a cavity structure according to additional aspects of the present disclosure.
Figure 9B:
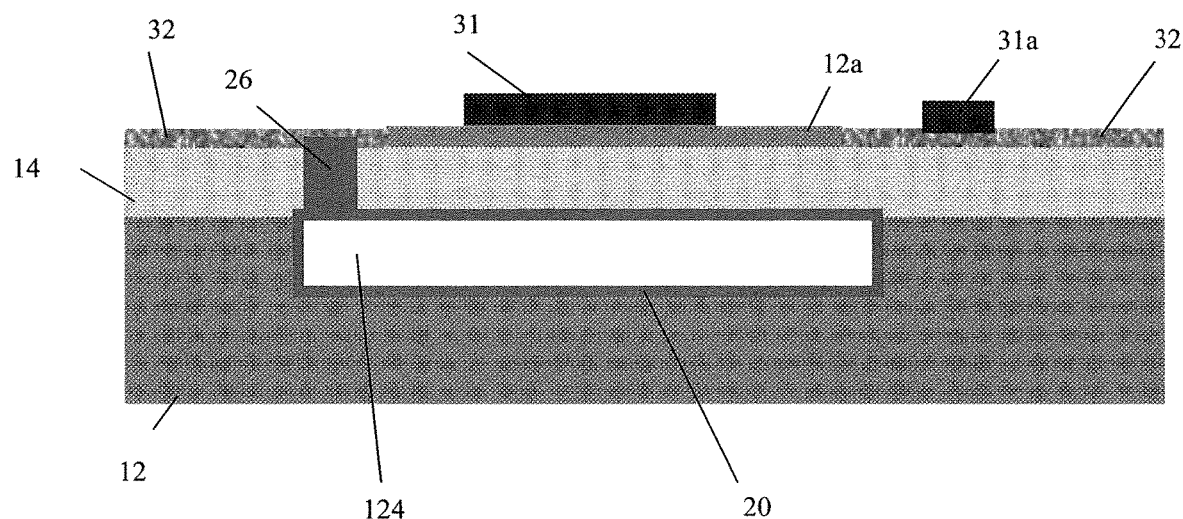
FIGS. 9B and 9C show different cross-sectional views of the structure of FIG. 9A.
Figure 9C:
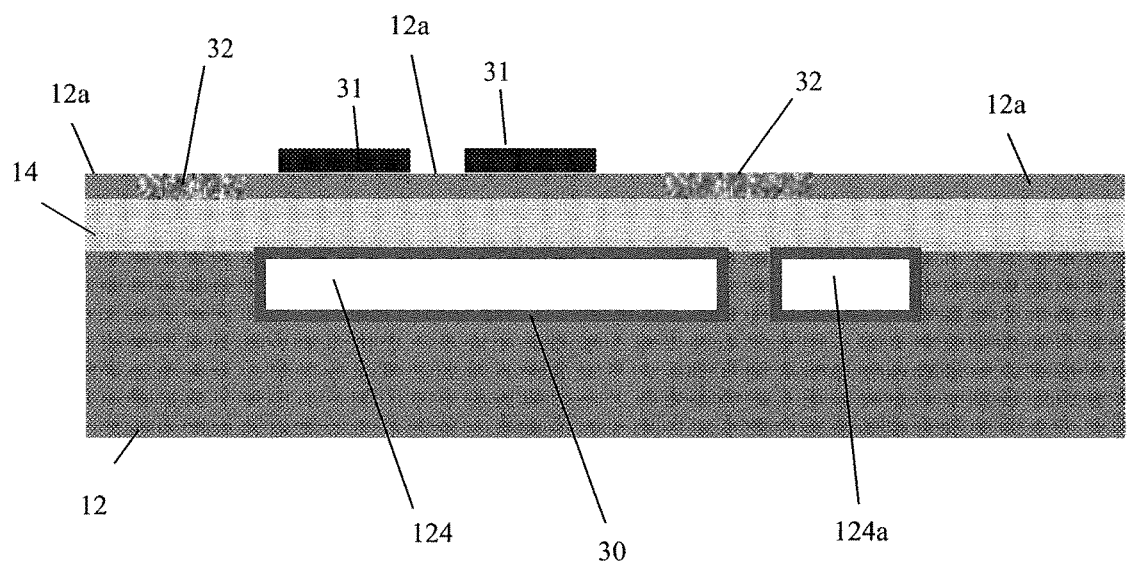

FIG. 8 shows an optional embodiment in which an electrode is formed. This electrode may be used, for example, as an electrode in microfluidic MEMs application; or as an active or passive device as discussed below. The electrode 31 could be formed with a subtractive metal etch process (shown) or a damascene process (not shown) as known in the art. If a damascene process is used, then the insulator layer 26a would be planarized prior to damascene trench formation, if needed. FIG. 9A shows a top view of a structure with a one or more devices. FIG. 9B shows a cross-sectional view of the structure of FIG. 9A along line A-A; FIG. 9C shows a cross-sectional view of the structure of FIG. 9A along line B-B. As shown in the structure 10a of FIGS. 9A-9C, cavity structures 24, 24' are optionally lined with an oxide material 26a and formed in the bulk wafer 12. In this embodiment, the two cavity structures 24, 24' are of a uniform depth and can be formed with the same masking and implantation processes. It should also be understood that more than two cavity structures can be formed, depending on the patterned mask used with the implantation process; or multiple depth cavities can be formed with the use of additional photomasks.

In FIGS. 9B-9C, shallow trench isolation (STI) oxide 32 isolates the SOI top silicon layer 12a. The STI oxide 32 could be formed from the cavity sealing dielectric 26b or from another dielectric deposition. In embodiments, STI dielectric is from, for example, a high density plasma chemical vapor deposition (HDPCVD) of $SiO_2$ as known in the art. If the STI dielectric is formed from the cavity sealing dielectric 26b, then the insulator material, e.g., thermal oxide layer, 30 could be used as a thermal oxide liner of the STI trenches prior to HDPCVD oxide deposition.

Still referring to FIGS. 9A-9C, a plurality of wires 31 and 31a are formed on the semiconductor material 12a over cavity structure s 124 and 124a; although it is contemplated that one or more wires can be formed over any combination of the cavity structures. Moreover, shallow trench isolation structures 32 are formed in the semiconductor material 12a, reaching down to the underlying BOX layer 14.

In embodiments, the wires 31 and 31a can instead be any active or passive devices, e.g., transistors, MOS capacitors, or resistors, formed by conventional CMOS fabrication processes. For example, FET devices 31 can be formed by gate first or gate last processes as known to those of skill in the art such that no further explanation is required for a complete understanding of the present disclosure. These FET devices 31 include gate dielectric material, e.g., high-k materials, and sidewall spacers formed on the sidewalls of gate electrode material, each of which can be implemented using conventional CMOS fabrication structures as described herein. Source and drain regions are formed within the substrate material using convention ion implantation processes or doped epitaxial material processes as is known by those of skill in the art. Passive devices 31a, e.g., resistors or capacitors, are formed over shallow trench isolation 32.

The structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
   a bulk substrate with at least one rectilinear cavity structure;
   an insulator material sealing the at least one rectilinear cavity structure;
   a buried insulator layer on the bulk substrate and over the at least one rectilinear cavity structure; and a semiconductor material on the buried insulator layer and above the at least one rectilinear cavity structure, wherein the insulator material is over and contacts the semiconductor material, wherein the insulator material is over the buried insulator layer and extends within an opening of the buried insulator layer, which seals the at least one rectilinear cavity structure.

2. The structure of claim 1, wherein the at least one rectilinear cavity structure is lined with insulator material.

3. The structure of claim 2, wherein the insulator material suppresses traps.

4. The structure of claim 3, wherein the insulator material is thermal $SiO_2$.

5. The structure of claim 1, further comprising a shallow trench isolation region formed in the semiconductor material above the buried insulator layer and at least one wire on at least one of the semiconductor material above the at least one rectilinear cavity structure and the shallow trench isolation region.

6. The structure of claim 1, wherein the at least one rectilinear cavity structure is plural cavity structures of different dimensions.

7. The structure of claim 1, wherein the at least one rectilinear cavity structure is plural cavity structures of a same depth within the bulk substrate.

8. The structure of claim 1, wherein the at least one rectilinear cavity structure is plural cavity structures separated from each other.

9. The structure of claim 1, wherein the at least one rectilinear cavity structure is a single rectilinear cavity with different depths.

10. The structure of claim 1, wherein the bulk substrate is a single crystalline semiconductor material and the rectilinear cavity structure is bounded by the single crystalline semiconductor material and, at is top surface, the buried insulator layer.

11. A structure comprising:
a bulk substrate with at least one rectilinear cavity structure;
an insulator material sealing the at least one rectilinear cavity structure;
a buried insulator layer on the bulk substrate and over the at least one rectilinear cavity structure; and
an electrode contacting the insulator material,
wherein the insulator material is over the buried insulator layer and extends within an opening of the buried insulator layer, which seals the at least one rectilinear cavity structure,
wherein the at least one rectilinear cavity structure forms part of a microfluidic device, and
wherein the electrode is a plurality of wires directly contacting the insulator material.

12. A structure comprising:
a bulk substrate with at least one rectilinear cavity structure;
an insulator material sealing the at least one rectilinear cavity structure; and a buried insulator layer on the bulk substrate and over the at least one rectilinear cavity structure; and
a semiconductor material on the buried insulator layer and above the at least one rectilinear cavity structure, wherein the insulator material extends over and contacts the semiconductor material,
wherein the insulator material is over the buried insulator layer and extends within an opening of the buried insulator layer, which seals the at least one rectilinear cavity structure, and
wherein the at least one rectilinear cavity structure is hermetically sealed, and
wherein the at least one rectilinear cavity structure is plural cavity structures.

13. A structure comprising:
a bulk substrate of single crystalline material;
a buried insulator layer on the bulk substrate; and
at least one rectilinear cavity structure within the bulk substrate with a top surface being the buried insulator layer;
dielectric material extending over an upper surface of the buried insulator layer; and
a semiconductor material on the buried insulator layer and above the at least one rectilinear cavity structure, wherein the dielectric material extends over and contacts the semiconductor material,
wherein the least one rectilinear cavity structure is plural cavity structures.

14. The structure of claim 13, wherein the least one rectilinear cavity structure is lined with insulator material and further comprising shallow trench isolation structures in the semiconductor material and over the at least one rectilinear cavity structure.

15. The structure of claim 13, wherein the at least one rectilinear cavity structure has a stepped feature, lined with insulator material.

16. The structure of claim 13, further comprising an electrode above the at least one rectilinear cavity and the dielectric material, which forms a microfluidic device.

17. A method comprising:
forming amorphous region of a first depth within a bulk substrate, below a buried oxide layer of semiconductor on insulator (SOI) technologies;
forming a vent hole through the buried oxide layer to expose the amorphous region;
removing the amorphous region through the vent hole to form at least one cavity structure at the first depth within the bulk substrate;
lining the at least one cavity structure with insulator material;
forming a single crystalline semiconductor material on the buried oxide layer; and
sealing the vent hole with dielectric material, which is also formed on a top surface of the buried oxide layer and a top surface of the single crystalline semiconductor material.

* * * * *